United States Patent [19]

Abe et al.

[11] 4,012,762
[45] Mar. 15, 1977

[54] SEMICONDUCTOR FIELD EFFECT DEVICE HAVING OXYGEN ENRICHED POLYCRYSTALLINE SILICON

[75] Inventors: Motoaki Abe, Hiratsuka; Teruaki Aoki, Tokyo, both of Japan

[73] Assignee: Sony Corporation, Tokyo, Japan

[22] Filed: June 16, 1975

[21] Appl. No.: 587,153

[30] Foreign Application Priority Data

June 24, 1974  Japan .............................. 49-72078

[52] U.S. Cl. .................................. 357/52; 357/23; 357/42; 357/54; 357/59
[51] Int. Cl.² ........................................ H01L 29/34
[58] Field of Search ................. 357/23, 42, 52, 53, 357/54, 59

[56] References Cited

UNITED STATES PATENTS

| | | | |
|---|---|---|---|
| 3,576,478 | 4/1971 | Watkins | 357/59 |
| 3,649,884 | 3/1972 | Haneta | 357/54 |
| 3,710,204 | 1/1973 | Batz | 357/53 |
| 3,841,926 | 10/1974 | Garnache et al. | 357/54 |
| 3,971,061 | 7/1976 | Matsushita et al. | 357/59 |
| 3,977,019 | 8/1976 | Matsushita et al. | 357/52 |

FOREIGN PATENTS OR APPLICATIONS 300,472  4/1968  Sweden .............................. 357/53

OTHER PUBLICATIONS

H. Lin et al., "Shielded Silicon Gate Comp. MOS Integ. Ckt.," IEEE Trans. on Elec. Dev., vol. ED-19, No. 11, Nov. 1972, pp. 1199–1207.

Primary Examiner—Michael J. Lynch
Assistant Examiner—Joseph G. Clawson, Jr.
Attorney, Agent, or Firm—Hill, Gross, Simpson, Van Santen, Steadman, Chiara & Simpson

[57] ABSTRACT

A Metal Insulator Semiconductor (MIS) field effect device has an oxygen-doped polycrystalline silicon layer on the field portion in order to prevent an unwanted parasitic inversion layer. The oxygen-doped polycrystalline silicon layer contains oxygen in the range of 2 to 40 atomic percent.

7 Claims, 12 Drawing Figures

PRIOR ART
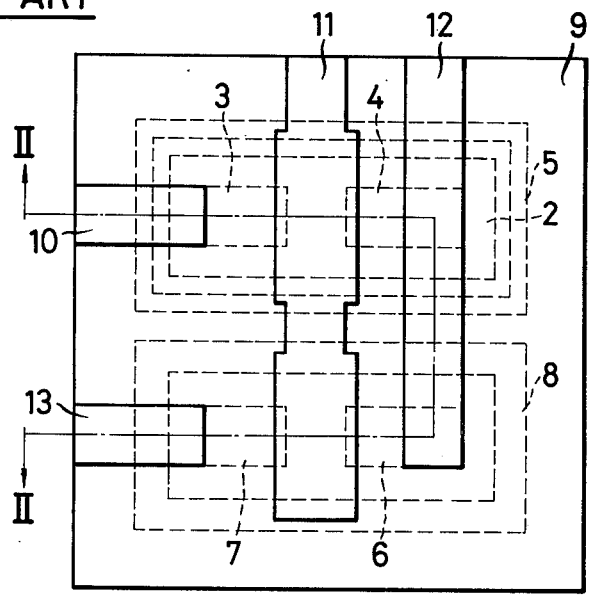
FIG.1
FIG.2  PRIOR ART
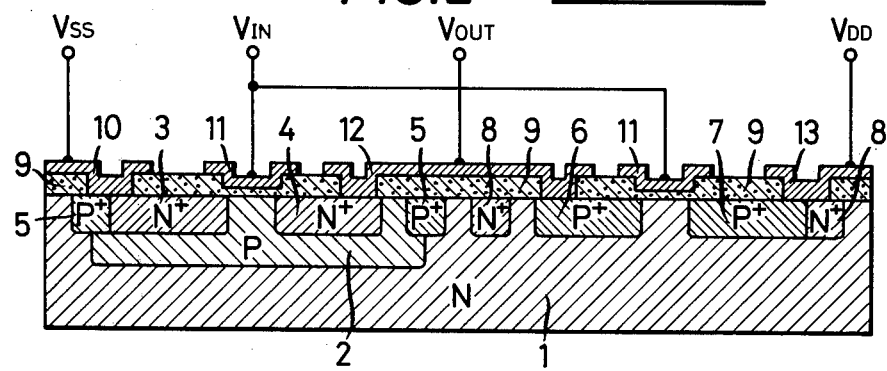
PRIOR ART
FIG.3
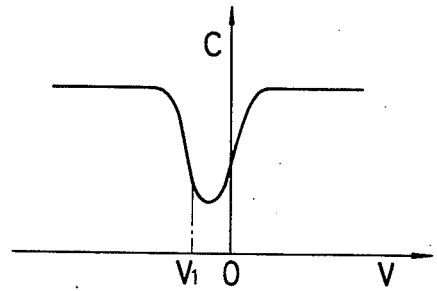

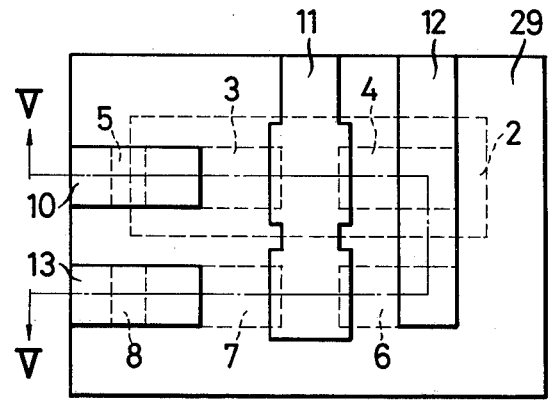
FIG.4
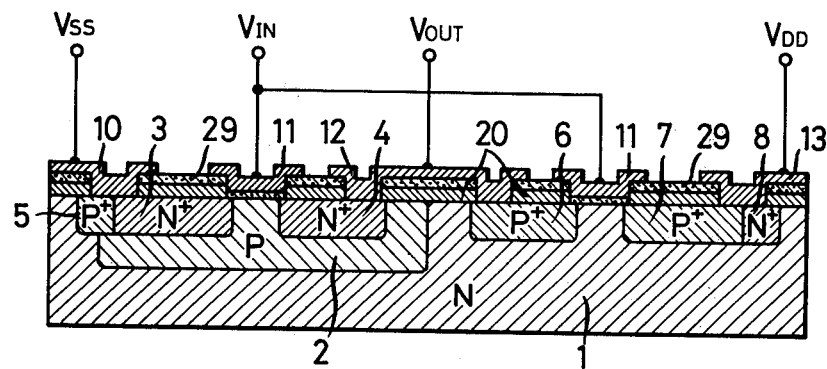
FIG.5
FIG.6
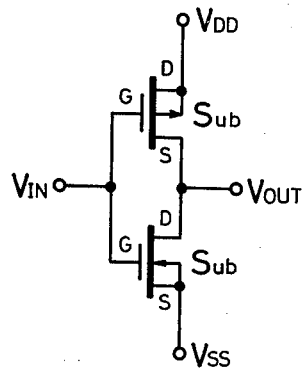
FIG.8
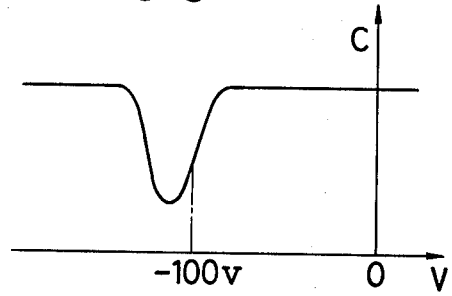

SEMICONDUCTOR FIELD EFFECT DEVICE HAVING OXYGEN ENRICHED POLYCRYSTALLINE SILICON

BACKGROUND OF THE INVENTION

1. Field of the Invention

This invention relates to structure for a MIS device, and in particular, to a structure for preventing an unwanted inversion layer of a field portion (other than an active region of the MIS device).

2. Description of the Prior Art

When a plurality of MIS FETs are formed in a single semiconductor substrate, they are electrically connected to each other through a metallic interconnection layer overlying a protective layer formed on one fce of the substrate. And when a voltage is applied to the metallic interconnection layer, an electric field from the metallic interconnection layer builds up an electric charge in an interface region between the semiconductor substrate and the protective layer. Because of this, unwanted parasitic conduction paths are induced in the surface region of the semiconductor substrate. If the unwanted parasitic conduction paths are induced between active regions of the MIS FETs, the active regions are short-circuited.

In one conventional method for preventing the unwanted parasitic conduction paths, the thickness of the protective layer over the field portion is increased. The unwanted parasitic conduction paths or the inversion paths can be avoided by this method, but it is difficult to manufacture a thick protective layer without trouble. For example, edge portions of the metallic interconnection layer over the thick protective layer are apt to break.

In another conventional method for suppressing the spread of the unwanted inversion paths, a special region, called a channel stopper region, is formed in the semiconductor substrate. Such a method will be described in detail with reference to a C/MOS inverter circuit as shown in FIG. 1 and FIG. 2. In referring to FIG. 2, note that it is taken along a section line going from the left hand edge to the electrode 11, then downwardly and finally back to the left hand edge again.

A P-type semiconductive region 2 is formed in the left half (FIG. 2) of an N-type silicon semiconductor substrate 1. N-type semiconductive regions 3 and 4 as a source region and a drain region are formed in the P-type semiconductive region 2. A P-type semiconductive region 5 as a channel stopper region is formed around the P-type semiconductive region 2, so as to surround the N-type semiconductive regions 3 and 4. P-type semiconductive regions 6 and 7 as a source region and a drain region are formed in the right half (FIG. 2) of the N-type semiconductor substrate 1. An N-type semiconductive region 8 as a channel stopper region is formed around the P-type semiconductive regions 6 and 7. A $SiO_2$ layer 9 is formed on the semiconductor substrate 1 and openings are made therein which are filled with electrodes 10, 12 and 13, respectively. Moreover, a recess is made in the $SiO_2$ layer 9. This recess is filled with an electrode 11. One MIS-FET comprises the electrode 11, the P-type semiconductive region 2 and the $SiO_2$ layer 9 interposed between the electrode 11 and the P-type semiconductive region 2. Another MIS-FET comprises the electrode 11, the N-type semiconductor substrate 1 and the $SiO_2$ layer 9 interposed between the electrode 11 and the N-type semiconductor substrate 1. An input voltage $V_{IN}$ is applied to the electrode 11. An output voltage $V_{OUT}$ is obtained from the electrode 12 which extends between the N-type semiconductive region 4 and the P-type semiconductive region 6. Thus, a complementary C/MOS inverter is constituted by the two MIS FETs.

The surface regions of the semiconductor substate 1 except the active regions, namely, the N-type semiconductive regions 3 and 4, the P-type semiconductive regions 6 and 7 and the portions lying right under the electrode 11 are called "field portions" or "parasitic portions". MOS-structures are formed at the field portions. According to the low frequency measurement of the C–V characteristics of the MOS-structure, the capacitance changes with the increase of the absolute value of the applied negative voltage, as shown in FIG. 3. The capacitance rapidly rises at the voltage $V_1$. It is known from the fact that an inversion layer is formed in the field portion.

When a high voltage is applied to the electrode, the inversion layer is formed in the surface region of the semiconductor substrate. Accordingly, a channel is formed between the two MOS-FETs due to the inversion layer. When the MOS-FETs are operated at a high speed, a high voltage is applied to the MOS-FETs. In such a case, a higher threshold voltage $V_{TH}$ is required for the field portion. For that purpose, it is necessary to arrange the P-type semiconductive region 5 and the N-type semiconductive region 8 as channel stopper regions, or to thicken the $SiO_2$ layer 9. Generally, the impurity concentration is $10^{14}$–$10^{15}$ atoms/cm$^3$ in the semiconductor substrate 1, while it is $10^{15}$–$10^{16}$ atoms/cm$^3$ in the surface region of the P-type semiconductive region 2. When a <100> oriented silicon is used in the above-mentioned condition of the impurity concentrations, the threshold voltage $V_{TH}$ for the field portion is as little as about 10V at the thickness 1 micron of the $SiO_2$ layer 9.

However, when the channel stopper regions are arranged in the semiconductor substrate without widening the surface area of the semiconductor substrate, they contact with the drain region, so that the breakdown voltage of the drain region is lowered. Since it is undesirable to lower the breakdown voltage of the drain region, the drain region and the channel stopper regions should be spaced from each other by over several microns. Accordingly, the surface area of the semiconductor becomes wider. This is very disadvantageous.

When a $SiO_2$ layer as an insulating layer is formed on the field portion, the conventional MOS-FET is not stable against sodium ions (Na$^+$) in bias temperature stress between the electrode and the semiconductor substrate. The threshold voltage $V_{TH}$ for the field portion varies. This creates a problem as to reliability in the conventional MOS-FET.

SUMMARY OF THE INVENTION

An object of this invention is to provide a structure for a MIS field effect device by which a threshold voltage for a field portion can be greatly raised, and thereby an unwanted inversion layer can be prevented from being formed in the field portion.

Another object of this invention is to provide a structure for a MIS field effect device by which a conventional channel stopper region can be removed, and thereby the density of an integrated circuit can be raised.

A further object of this invention is to provide a structure for a MIS field effect device by which instability for sodium ion (Na+) or the like can be greatly reduced in bias temperature stress.

A still further object of this invention is to provide a structure for a MIS field effect device by which the breakdown voltage of the drain region can be improved.

According to one form of this invention, a polycrystalline silicon layer containing oxygen in the range of 2 to 40 atomic percent is formed on a semiconductor substrate, and an electrode is arranged over the polycrystalline silicon layer.

The foregoing and other objects, features and advantages of the invention will be apparent from the following more particular descriptions of preferred embodiments of the invention, as illustrated in the accompanying drawings.

BRIEF DESCRIPTION OF THE DRAWINGS

FIG. 1 is a plan view of a conventional $C/_{MOS}$ inverter;

FIG. 2 is a cross-sectional view taken along the line II—II of FIG. 1;

FIG. 3 is a graph showing the C-V characteristic of the field portion of the conventional $C/_{MOS}$ inverter;

FIG. 4 is a plan view of a $C/_{MOS}$ inverter according to one embodiment of this invention;

FIG. 5 is a cross-sectional view taken along the line V—V of FIG. 4;

FIG. 6 is a circuit diagram equivalent to the C/MOS inverter of FIG. 4 and FIG. 5;

FIG. 8 is a graph showing the C-V characteristic of a MIS capacitor using the polycrystalline silicon layer shown in FIG. 5;

DESCRIPTION OF THE PREFERRED EMBODIMENTS

Figure 7:
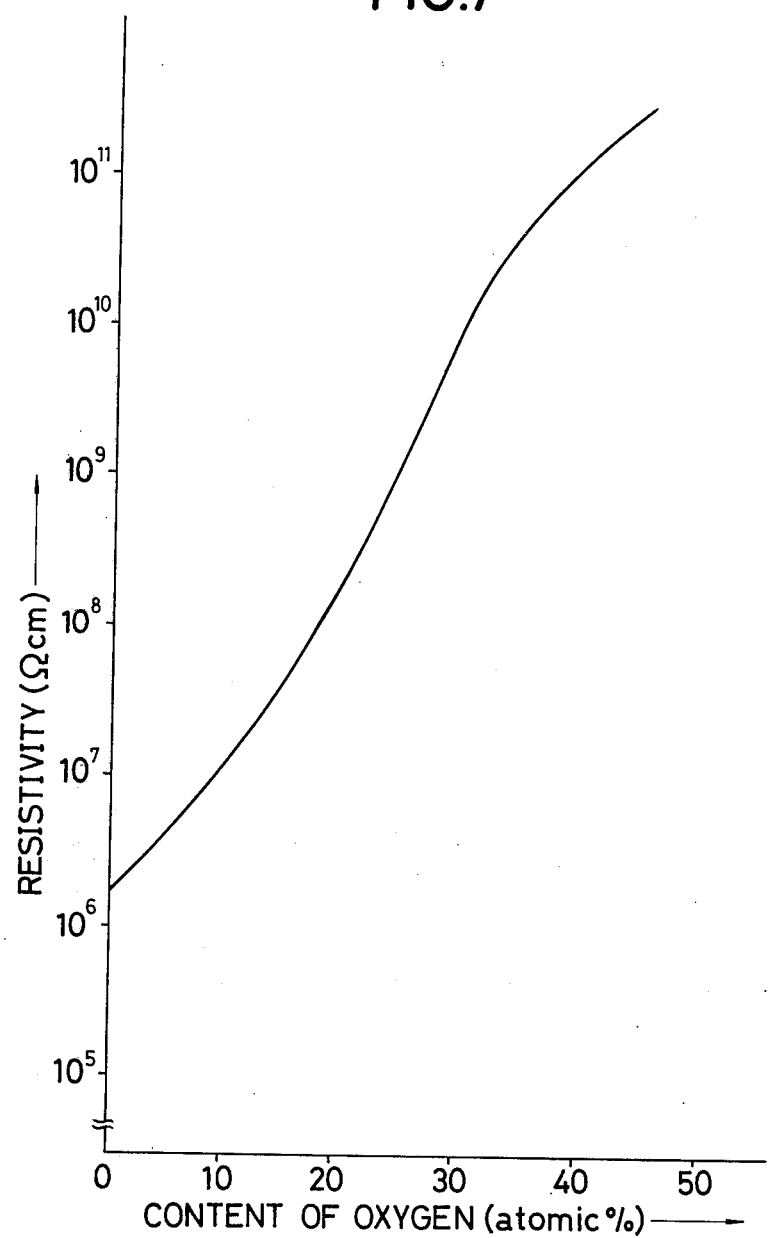
FIG. 7 is a graph showing the relationship between the content of oxygen and resistivity of polycrystalline silicon.

A C/MOS inverter according to one embodiment of this invention will be described with reference to FIG. 4 to FIG. 11.

First, the construction of the C/MOS inverter will be described with reference to FIG. 4 to FIG. 6. The conventional channel stopper regions are not arranged in the C/MOS inverter according to this invention. Moreover, the C/MOS inverter according to this invention is different from the conventional C/MOS inverter of FIG. 1 and FIG. 2 in construction of an insulating layer formed on a semiconductor substrate. Parts in FIG. 4 and FIG. 5 which correspond to the parts in FIG. 1 and FIG. 2, are referenced with the same reference numerals, and will not be described.

One MOS FET is arranged adjacent to another MOS FET in one semiconductor substrate 1. A polycrystalline silicon layer 20, the composition of which will be described below, is formed to the thickness of 3000 A on the field portion of the semiconductor substrate 1. A SiO₂ layer 29 is formed to the thickness of 8000 A on the polycrystalline silicon layer 20. The thickness of the polycrystalline silicon layer 20 can be selected suitably within the range of 1000 A to 20000 A, depending on the voltage applied to the electrode arranged over the polycrystalline silicon layer 20. FIG. 6 shows a circuit equivalent of the C/MOS inverter of FIG. 4 and FIG. 5.

The polycrystalline silicon layer 20 comprises a polycrystalline silicon and oxygen added into the polycrystalline silicon in the concentration range of 2 to 40 atomic percent, for example, at a concentration of 32 atomic percent. The grain size of the polycrystalline silicon should preferably be 100 A to 1000 A. Electrons and holes are trapped in trap energy levels of grain boundaries of pure polycrystalline silicon to form a constant electrostatic potential. Since carriers are repelled by the electrostatic potential, the pure polycrystalline silicon exhibits a constant resistivity, for example, 10⁶Ω cm. When oxygen is added into the pure polycrystalline silicon, $Si_xO_y$ compounds are abundantly formed in the grain boundaries. Accordingly, the barrier potentials are raised in the grain boundaries. The resistivity of the polycrystalline silicon increases with the content of the oxygen, as shown, for example, in FIG. 7. For example, the resistivity of the polycrystalline silicon can increase to $10^{11}Ω$ cm.

A MIS capacitor as a test sample was prepared to verify the effect of this invention. The MIS capacitor comprises an N-type silicon semiconductor substrate, a polycrystalline silicon layer as above mentioned, deposited on the N-type silicon semiconductor substrate and an electrode formed on the polycrystalline silicon layer. As the result of the low frequency measurement of the MIS capacitor, the C-V characteristic as shown on FIG. 8 was obtained. FIG. 8 shows that the inversion layer is not formed in the surface region of the semiconductor substrate even when a relatively high negative voltage such as 100V is applied to the electrode. Electrons in the surface region are repelled away by the negative potential applied to the electrode to form a depletion layer in the surface region of the semiconductor substrate. Holes in the semiconductor substrate are attracted into the depletion layer, but they are not stored in the surface region. The reason is considered to be that electrons and holes are recombined in the interface between the polycrystalline silicon layer and the semiconductor substrate.

Figure 9:
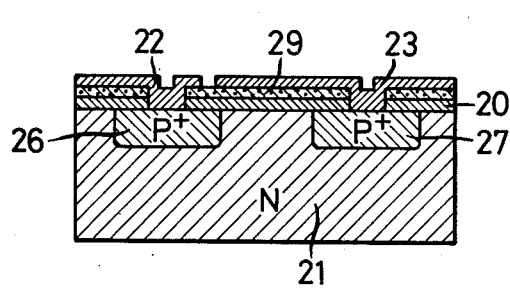
FIG. 9 is a cross-sectional view of a FET using as an oxide film gate the polycrystalline silicon layer shown in FIG. 5.
Figure 10:
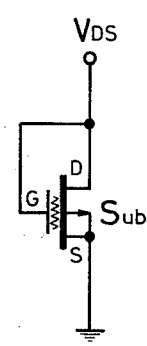
FIG 10 is a circuit diagram equivalent to the FET of FIG. 9.
Figure 11:
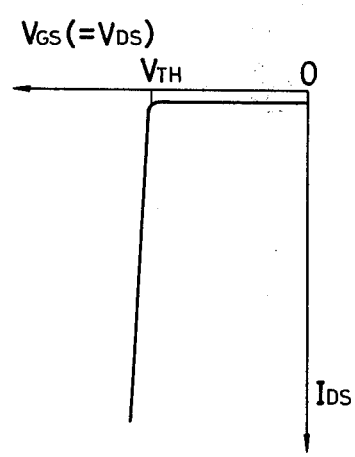
FIG. 11 is a graph showing the $V_{GS}$–$I_{DS}$ characteristic of the FET of FIG. 9.

A FET as shown in FIG. 9 was prepared in order to verify that the inversion layer is not easily formed in the surface region of the semiconductor substrate. In the FET, P⁺-type semiconductive regions 26 and 27 were formed as a source region and as a drain region in an N-type semiconductive region 21 having a resistivity of 2 to 3 Ω cm. The polycrystalline silicon layer 20 was formed to the depth of 3000 A on the semiconductor substrate 21. The SiO₂ layer 29 was formed, to the depth of 5000 A, on the polycrystalline silicon layer 20. Openings were made in the polycrystalline silicon layer 20 and the SiO₂ layer 29. The openings were filled with electrodes 22 and 23. The V-I characteristic of the FET was measured. The result of the measurement is shown on FIG. 11. This proves that a current $I_{DS}$ rapidly increases at a voltage $V_{GS}$ of about minus 110V when the absolute value of the negative voltage $V_{GS}$ (= $V_{DS}$) increases. Since the threshold voltage $V_{TH}$ is so high, the inversion layer is not easily formed in the surface region.

As apparent from the above description, since the polycrystalline silicon layer 20 is formed on the field portion in the embodiment of this invention, the inversion layer is not formed in the surface region of the semiconductor substrate even when the high negative voltage is applied to the electrode, and the threshold voltage $V_{TH}$ of the field portion can be greatly increased, for example, over 100 volts. Accordingly, the conventional channel stopper region is not needed between the two MOS-FETs. There is no possibility that the breakdown voltage of the drain region will be lowered. The surface area of the semiconductor substrate can be reduced, and so the packing density of integrated circuits can be greatly improved. Patterns for forming the channel stopper region can be removed from a mask, and hence the lay-out of patterns can be simplified. Moreover, the instability for $Na^+$ can be greatly reduced.

The polycrystalline silicon containing oxygen at a conentration of over 40 atomic percent is similar to $SiO_2$. Such polycrystalline silicon has the disadvantage that it is easy to form the inversion layer. Also, the polycrystalline silicon containing oxygen at a concentration under 2 atomic percent has the disadvantage that some leakage currents flow between the semiconductor substrate 1 and the P-type semiconductive region 2 through the layer of such polycrystalline silicon. According to this invention, when the polycrystalline silicon contains oxygen in the concentration range of 2 to 40 atomic percent, the abovementioned disadvantages do not occur. A slightly more limited concentration range of 2 to 36 atomic percent is to be preferred. When the concentration of oxygen is relatively low in the range of 2 to 40 atomic percent, it is preferable to form a $SiO_2$ layer 29 on the polycrystalline silicon layer 20, as in the embodiment.

Next, the outline of a method for forming the polycrystalline silicon layer 20 will be described.

A semiconductor substrate is put in a vapor growth apparatus. A mixed gas of monosilane $SiH_4$ and dinitrogen monoxide $N_2O$ is fed into the vapor growth apparatus. The semiconductor substrate is heated to 650° C. Polycrystalline silicon is deposited onto the semiconductor substrate by the thermal decomposition of monosilane. At the same time, oxygen derived from $N_2O$ is nearly uniformly mixed into the polycrystalline silicon. Thus, a polycrystalline silicon layer containing a predetermined quantity of oxygen can be formed on the semiconductor substrate.

The relationship between the concentration of oxygen and the flow ratio of $N_2O$ to $SiH_4$ is shown on Table 1, as follows:

TABLE 1

| Ratio Of $N_2O/SiH_4$ | Concentration of Oxygen (atomic %) |
|---|---|
| 1/3 | 26.8 |
| 2/3 | 34.8 |
| 1 | 36.4 |
| 2 | 40 |

As is apparent from Table 1, the concentration of atomic percent oxygen increases nearly linearly as the logarithm of the ratio of $N_2O/SiH_4$.

Although this invention has been described with respect to one embodiment, it is to be understood that further modifications can be made on the basis of the technical concept of this invention.

Figure 12:
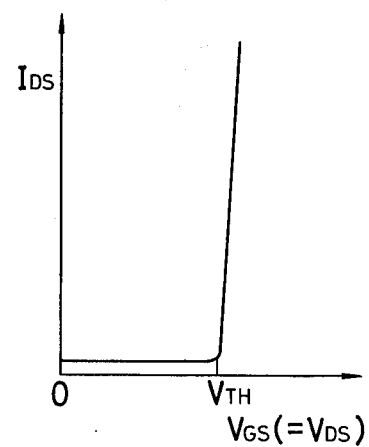
FIG. 12 is a graph showing the $V_{GS}$–$I_{DS}$ chracteristic of a FET in which conductivity types of semiconductive regions are interchanged with respect to the FET of FIG. 9.

For example, when the polycrystalline silicon layer contains oxygen at a higher concentration in the range of 2 to 40 atomic percent, the $SiO_2$ layer need not be formed on the polycrystalline silicon layer. The polycrystalline silicon layers may be formed only under the metallic interconnection layers in a semiconductor device including a MOS-FET. The conductivity types of the semiconductive regions may be interchanged. When a P-type semiconductor substrate having resistivity of 5 to 8 $\Omega$ cm is used instead of the N-type semiconductor substrate 21 in FIG. 9, the V-I characteristic shown in FIG. 12 is obtained, where the threshold voltage $V_{TH}$ is about plus 120 volts. Moreover, this invention can be applied in addition to a channel stopper region of a conventional MOS-FET.

According to this invention, since the polycrystalline silicon layer containing oxygen in the concentration range of 2 to 40 atomic percent is formed on the semiconductor substrate, and the electrode is formed on the polycrystalline silicon layer, it is difficult for an inversion layer to be formed in the surface region of the semiconductor substrate, and hence the threshold voltage $V_{TH}$ of the field portion can be greatly increased. Accordingly, the channel stopper region need not be formed in the semiconductor substrate, and therefore, the surface area of the semiconductor substrate can be reduced to high density.

It will be apparent to those skilled in the art that many modifications and variations may be effected without departing from the spirit and scope of the novel concepts of the present invention.

We claim as our invention:

1. A metal insulator semiconductor field effect transistor structure comprising,
    a. a substrate of semiconductor material of one conductivity type having one major surface,
    b. source and drain region of another conductivity type produced in said substrate,
    c. gate insulating layer and gate electrode disposed between said source and drain region on said major surface,
    d. a layer of polycrystalline silicon containing oxygen in the range of 2 to 40 atomic percent in electrical contact with parasitic portions of said one major surface,
    e. a silicon dioxide layer overlaying and extending along at least one portion of said layer of polycrystalline silicon, and
    f. an interconnection layer of conductive material overlaying and extending along at least one portion of said silicon dioxide layer.

2. A metal insulator semiconductor field effect transistor structure according to claim 1, wherein said layer of polycrystalline silicon has a thickness in the range of 1000 A to 2 $\mu$.

3. A metal insulator semiconductor field effect transistor structure according to claim 1, wherein said conductive material is aluminum.

4. A metal insulator semiconductor field effect device comprising:
    a. a semiconductor substrate having one conductivity;
    b. a semiconductive region having the opposite conductivity, formed in said semiconductor substrate;

c. a first source semiconductive region and a first drain semiconductive region having said one conductivity, formed in said semiconductive region;
d. a second source semiconductive region and a second drain semiconductive region having said opposite conductivity, formed in said semiconductor substrate;
e. a layer of polycrystalline silicon containing oxygen in the range of 2 to 40 atomic percent in electrical contact with at least a field portion in said semiconductor substrate; and
f. an insulating layer at least extending over the regions between said first source semiconductive region and said first drain semiconductive region, and between said second source semiconductive region and said second drain semiconductive region.

5. A metal insulator semiconductor field effect transistor structure according to claim 1, wherein grain sizes of said polycrystalline silicon are in the range of 100 A to 1000 A.

6. A metal insulator semiconductor field effect device according to claim 4, wherein said insulating layer is formed of silicon dioxide.

7. A metal insulator semiconductor field effect device comprising a monocrystalline silicon substrate of one impurity type, a pair of complementary field effect transistors diffused into one major surface of said substrate, one of said field effect transistors comprising source and drain regions of said one impurity type with a channel region therebetween of the opposite impurity type, the other of said field effect transistors including source and drain regions of the opposite impurity type with the channel thereof being a portion of said substrate lying between said opposite impurity type source and drain regions, a layer of polycrystalline silicon containing oxygen in the range of 2 to 40 atomic percent in electrical contact with the surface of said substrate, said polycrystalline layer having openings therethrough above said channel regions, a layer of silicon dioxide covering said polycrystalline layer and covering the surface of said substrate lying at the base of said openings, metal electrodes in said openings above said channel regions externally connected together, further openings through said silicon dioxide layer and said polycrystalline layer above a portion of each of said source and drain electrodes, metal electrodes in said openings above said source and drain electrodes, the drain electrode of said first field effect transistor and the source electrode of said second field effect transistor being electrically connected together by a bridge portion which is integral therewith and which overlies a portion of said silicon dioxide layer lying therebetween.

* * * * *